US 11,374,032 B2

(12) United States Patent
Yang et al.

(10) Patent No.: US 11,374,032 B2
(45) Date of Patent: Jun. 28, 2022

(54) ARRAY SUBSTRATE, DISPLAY PANEL, AND DISPLAY DEVICE

(71) Applicant: BOE TECHNOLOGY GROUP CO., LTD., Beijing (CN)

(72) Inventors: Ming Yang, Beijing (CN); Minghua Xuan, Beijing (CN); Can Zhang, Beijing (CN); Can Wang, Beijing (CN); Han Yue, Beijing (CN); Ning Cong, Beijing (CN); Jiayao Liu, Beijing (CN); Wenqing Zhao, Beijing (CN); Li Xiao, Beijing (CN); Dongni Liu, Beijing (CN); Lei Wang, Beijing (CN); Liang Chen, Beijing (CN); Xiaochuan Chen, Beijing (CN); Shengji Yang, Beijing (CN); Pengcheng Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 70 days.

(21) Appl. No.: 16/642,584

(22) PCT Filed: Feb. 27, 2019

(86) PCT No.: PCT/CN2019/076250
§ 371 (c)(1),
(2) Date: Feb. 27, 2020

(87) PCT Pub. No.: WO2019/214323
PCT Pub. Date: Nov. 14, 2019

(65) Prior Publication Data
US 2020/0350338 A1 Nov. 5, 2020

(30) Foreign Application Priority Data
May 10, 2018 (CN) .......................... 201810443168.8

(51) Int. Cl.
G02F 1/1362 (2006.01)
G02F 1/1343 (2006.01)
(Continued)

(52) U.S. Cl.
CPC ............ *H01L 27/124* (2013.01); *G02B 30/26* (2020.01); *G02F 1/1368* (2013.01);
(Continued)

(58) Field of Classification Search
CPC ............ G02F 1/136286; G02F 1/1368; G02F 1/134336; G02F 1/1362; G02F 1/13439;
(Continued)

(56) References Cited

U.S. PATENT DOCUMENTS 5,877,830 A * 3/1999 Shimada ........... G02F 1/133512
349/110
2003/0011318 A1 1/2003 Kim
(Continued)

FOREIGN PATENT DOCUMENTS

CN 102053378 A 5/2011
CN 102902120 A 1/2013
(Continued)

OTHER PUBLICATIONS

First Office Action and English language translation, CN Application No. 201810443168.8, dated May 24, 2019, 10 pp.
(Continued)

Primary Examiner — Thoi V Duong
(74) Attorney, Agent, or Firm — Myers Bigel, P.A.

(57) ABSTRACT

There is provided an array substrate including a plurality of pixel regions arranged in rows and columns. The plurality of pixel regions include a corresponding pixel electrode array and a corresponding pixel circuit associated with the corresponding pixel electrode array. Each of the pixel electrode arrays is arranged in rows and columns, and each pixel
(Continued)

electrode array includes a plurality of pixel electrodes arranged in an array. The array substrate further includes a plurality of sets of gate lines extending in a row direction and a plurality of sets of data lines extending in a column direction. The plurality of sets of gate lines and rows of the pixel electrode arrays are alternately arranged with each other in the column direction. The plurality of sets of data lines and columns of the pixel regions are alternately arranged with each other in the row direction.

12 Claims, 7 Drawing Sheets

(51) Int. Cl.

| | | |
|---|---|---|
| *G02F 1/1368* | (2006.01) | |
| *H01L 27/12* | (2006.01) | |
| *G02B 30/26* | (2020.01) | |
| *G02F 1/1335* | (2006.01) | |
| *H01L 27/32* | (2006.01) | |
| *G09G 3/3266* | (2016.01) | |
| *G09G 3/3275* | (2016.01) | |
| *G09G 3/36* | (2006.01) | |

(52) U.S. Cl.
CPC .... *G02F 1/13439* (2013.01); *G02F 1/133526* (2013.01); *G02F 1/136286* (2013.01); *H01L 27/3276* (2013.01); *G02F 2201/123* (2013.01); *G09G 3/3266* (2013.01); *G09G 3/3275* (2013.01); *G09G 3/3677* (2013.01); *G09G 3/3688* (2013.01); *G09G 2300/0426* (2013.01); *G09G 2310/0205* (2013.01); *G09G 2310/0297* (2013.01)

(58) Field of Classification Search
CPC ............. G02F 1/1343; G02F 1/134309; G02F 1/16761; G02F 1/133526; G02F 2201/123; H01L 27/124; H01L 27/3276; G09G 2300/0426; G09G 2300/0804; G09G 3/3677; G09G 3/20; G09G 3/3688; G09G 3/3275; G09G 3/003; G09G 3/3266; G09G 2310/0205; G09G 2310/0297; G02B 27/0075; G02B 30/00; G02B 30/26; G09F 9/00

See application file for complete search history.

(56) References Cited

U.S. PATENT DOCUMENTS

| | | | |
|---|---|---|---|
| 2009/0262418 A1* | 10/2009 | Yun | H04N 13/317 359/463 |
| 2011/0096071 A1 | 4/2011 | Okamoto et al. | |
| 2011/0156993 A1* | 6/2011 | Ting | G09G 3/3648 345/87 |
| 2014/0049619 A1 | 2/2014 | Hsieh et al. | |
| 2014/0111749 A1* | 4/2014 | Won | G02F 1/136209 349/110 |
| 2015/0333114 A1 | 11/2015 | Xu | |
| 2017/0178578 A1 | 6/2017 | Du | |
| 2017/0249915 A1* | 8/2017 | Xi | G09G 3/2003 |

FOREIGN PATENT DOCUMENTS

| | | |
|---|---|---|
| CN | 202837748 U | 3/2013 |
| CN | 103985354 A | 8/2014 |
| CN | 104238165 A | 12/2014 |
| CN | 105261339 A | 1/2016 |
| CN | 106154667 A | 11/2016 |
| CN | 106293177 A | 1/2017 |
| CN | 106959784 A | 7/2017 |
| CN | 107093584 A | 8/2017 |
| EP | 2261975 A1 | 12/2010 |

OTHER PUBLICATIONS

Second Office Action and English language translation, CN Application No. 201810443168.8, dated Feb. 13, 2020, 9 pp.

* cited by examiner

ARRAY SUBSTRATE, DISPLAY PANEL, AND DISPLAY DEVICE

RELATED APPLICATIONS

The present application is a 35 U.S.C. 371 national stage application of a PCT International Application No. PCT/CN2019/076250, filed on Feb. 27, 2019, which claims the benefit of Chinese Patent Application No. 201810443168.8, filed on May 10, 2018, the entire disclosures of which are incorporated herein by reference.

TECHNICAL FIELD

The present disclosure relates to the field of display technologies, and in particular, to an array substrate, a display panel, and a display device.

BACKGROUND

Integral imaging is an autostereoscopic and multi-view three-dimensional imaging technology that captures and reproduces light fields by using two-dimensional microlens arrays. During the capturing process, an object space scene is imaged with a capture microlens array, and an image sensor at the focal plane of the microlens array is used to capture the resulting image. Since each microlens in the microlens array provides information of the scene from different directions, an array of elemental images with different perspectives is obtained, and each elemental image corresponds to a corresponding microlens of respective microlenses. During reproduction, an array of elemental images is displayed on a two-dimensional display, and a reproduction microlens array having the same parameters as those of a capture microlens array is used to transmit light emitted from the display. According to the principle of reversibility of light path, the reproduction microlens array gathers light from each elemental image to reproduce the object space scene.

Integral imaging requires image capture devices and displays with high resolution. Although various solutions have been proposed to improve PPI (pixel per inch), there is still a need for alternative solutions.

SUMMARY

According to an aspect of the disclosure, there is provided an array substrate comprising: a plurality of pixel regions arranged in rows and columns. The plurality of pixel regions comprise a corresponding pixel electrode array and a corresponding pixel circuit associated with the corresponding pixel electrode array. The pixel electrode arrays are arranged in rows and columns, and each pixel electrode array comprises a plurality of pixel electrodes arranged in an array. The array substrate further comprises a plurality of sets of gate lines extending in a row direction. The plurality of sets of gate lines and rows of the pixel electrode arrays are alternately arranged with each other in a column direction intersecting with the row direction. The array substrate further comprises a plurality of sets of data lines extending in the column direction. The plurality of sets of data lines and columns of the pixel regions are alternately arranged with each other in the row direction. Each pixel circuit is connected to a plurality of pixel electrodes of a corresponding one of the pixel electrode arrays, a corresponding set of gate lines of the plurality of sets of gate lines, and a corresponding set of data lines of the plurality of sets of data lines.

In some embodiments, each pixel circuit comprises a corresponding plurality of first transistors, and each first transistor of the plurality of first transistors comprises a gate electrode connected to a corresponding one gate line of the corresponding set of gate lines, a first electrode receiving a signal from a corresponding one data line of the corresponding set of data lines, and a second electrode connected to a corresponding one of the plurality of pixel electrodes of the corresponding one of the pixel electrode arrays.

In some embodiments, the gate electrodes of different first transistors connected to the pixel electrodes in different rows are connected to respective different gate lines of the corresponding set of gate lines, and the first electrodes of different first transistors connected to the pixel electrodes in different columns are connected to respective different data lines of the corresponding set of data lines.

In some embodiments, the plurality of pixel electrodes of each pixel electrode array are arranged in an M×N array, each set of gate lines comprises M gate lines, and each set of data lines comprises N data lines, M is an integer greater than 1, and N is an integer greater than or equal to 1.

In some embodiments, the plurality of pixel electrodes of each pixel electrode array are arranged in an M×N array, each set of gate lines comprises M gate lines, and each set of data lines comprises N data lines, M is an integer greater than or equal to 1, and N is an integer greater than 1.

In some embodiments, the array substrate further comprises a set of multiplexed lines extending in the column direction. Each set of data lines comprises a corresponding single data line, each pixel circuit comprises a plurality of pairs of transistors, and each pair of transistors comprises: a first transistor comprising a gate electrode connected to a corresponding one gate line of the corresponding set of gate lines, a first electrode, and a second electrode connected to a corresponding one of the plurality of pixel electrodes of the corresponding one of the pixel electrode arrays; and a second transistor comprising a gate electrode connected to a corresponding one multiplexed line of the set of multiplexed lines, a first electrode connected to the single data line of the corresponding set of data lines, and a second electrode connected to the first electrode of the first transistor.

In some embodiments, the gate electrodes of respective first transistors of different pairs of transistors connected to pixel electrodes in different rows are connected to respective different gate lines of the corresponding set of gate lines, and in each pixel region, the gate electrodes of the respective second transistors of different pairs of transistors connected to pixel electrodes in different columns are connected to respective different multiplexed lines of the set of multiplexed lines.

In some embodiments, the plurality of pixel electrodes of each pixel electrode array are arranged in an M×N array, each set of gate lines comprises M gate lines, and the set of multiplexed lines comprises N multiplexed lines.

In some embodiments, each pixel region further comprises a corresponding plurality of electrode leads, and each pixel circuit is connected to the corresponding one of the plurality of pixel electrodes of the corresponding one of the pixel electrode arrays via the corresponding plurality of electrode leads.

In some embodiments, the plurality of electrode leads are made of a transparent conductive material.

In some embodiments, the transparent conductive material comprises indium tin oxide or indium zinc oxide.

According to another aspect of the disclosure, there is provided a display panel comprising the array substrate as described above.

According to a further aspect of the disclosure, there is provided a display device comprising the display panel as described above.

In some embodiments, the display device further comprises a lens array on a light exit side of the display panel. The lens array comprises a plurality of lenses, a corresponding one of the plurality of lenses is arranged to be opposite to a corresponding one of the pixel electrode arrays.

These and other aspects of the present disclosure will be apparent from and elucidated with reference to the embodiments described below.

DETAILED DESCRIPTION OF EMBODIMENTS

Figure 1:
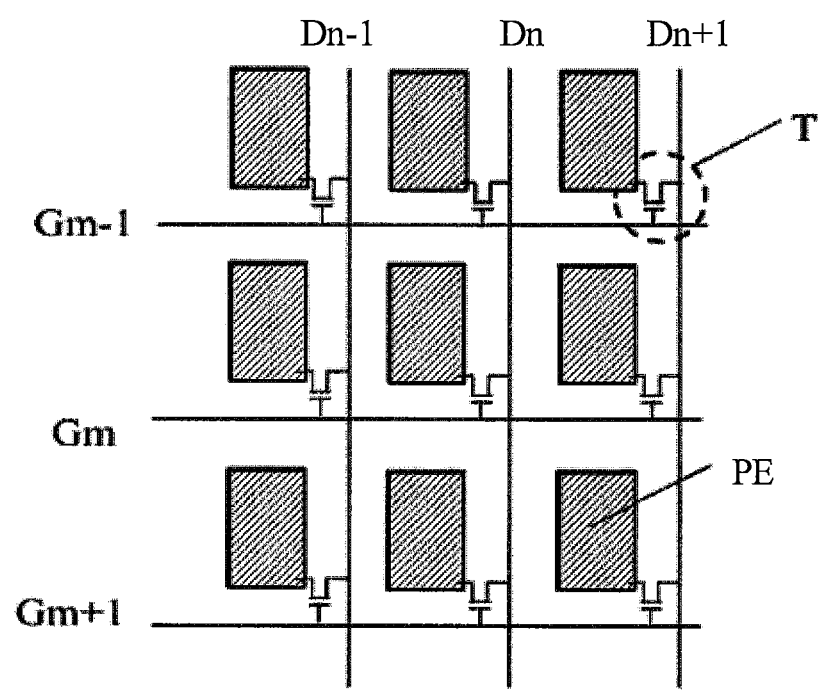
FIG. 1 illustrates a schematic structural diagram of an array substrate in the related art.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "row direction", "column direction", etc. may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "extending in the row direction" would then be oriented "extending in the column direction". Thus, the device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on", "directly connected to", "directly coupled to", or "immediately adjacent to" another element or layer, there are no intervening elements or layers present. In no event, however, should "on" or "directly on" be construed as requiring a layer to completely cover an underlying layer.

Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Any arrangement of devices to achieve the same function is effectively "associated" such that the desired function is achieved. Thus, any two devices combined herein to achieve a particular function may be considered to be "associated" with each other such that a desired function is achieved.

FIG. 1 illustrates a schematic structural diagram of an array substrate in the related art.

As shown in FIG. 1, gate lines, such as Gm−1, Gm, and Gm+1, intersect with data lines, such as Dn−1, Dn, and Dn+1 to define a plurality of pixel electrodes PE. Each pixel electrode PE is connected to a corresponding one of the gate lines and a corresponding one of the data lines via a corresponding thin film transistor T. In such an array substrate, each individual pixel electrode PE is separated by a gate line and a data line, resulting in a larger gap between the pixel electrodes PE and therefore a lower PPI.

Figure 2:
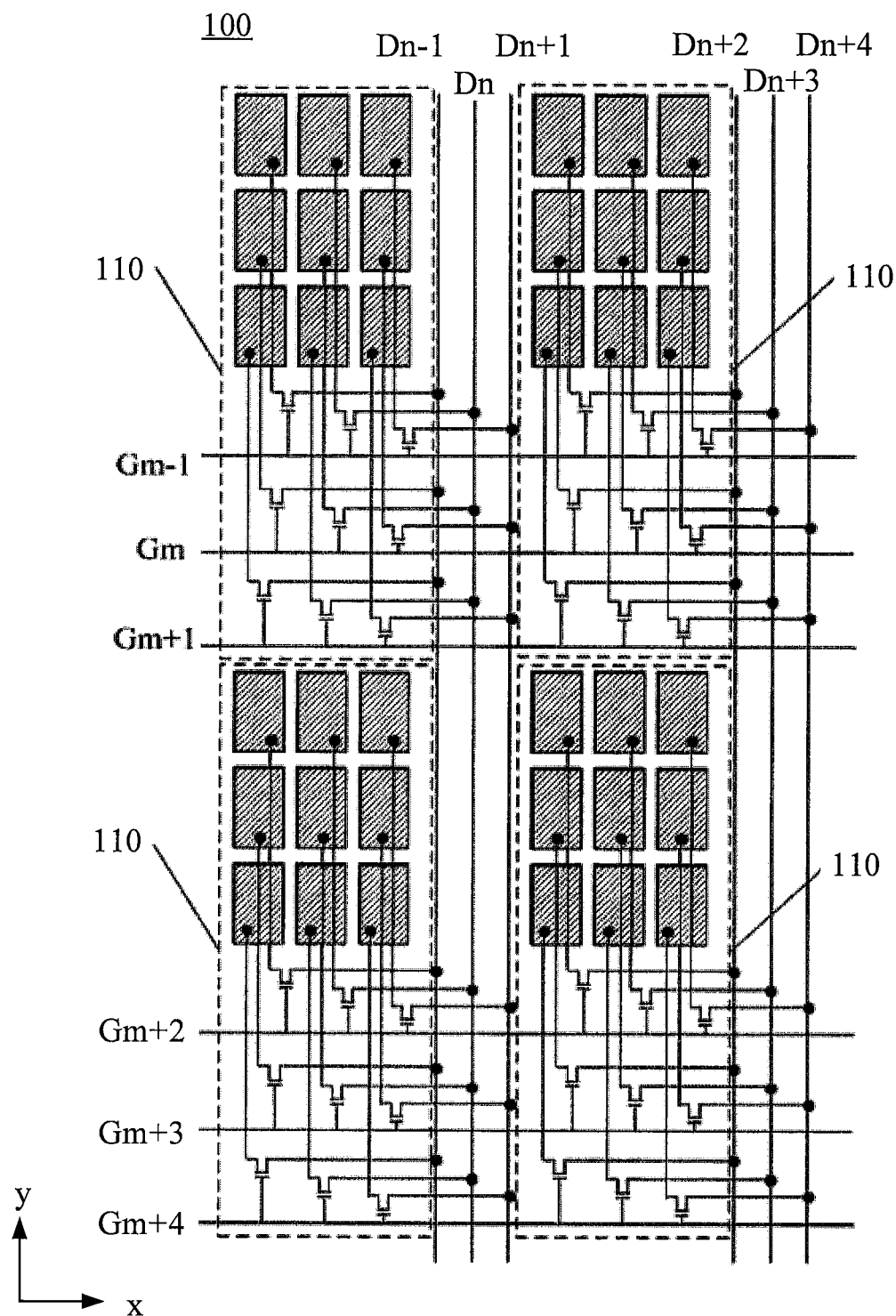
FIG. 2 illustrates a schematic structural diagram of an array substrate according to an embodiment of the present disclosure.
Figure 3:
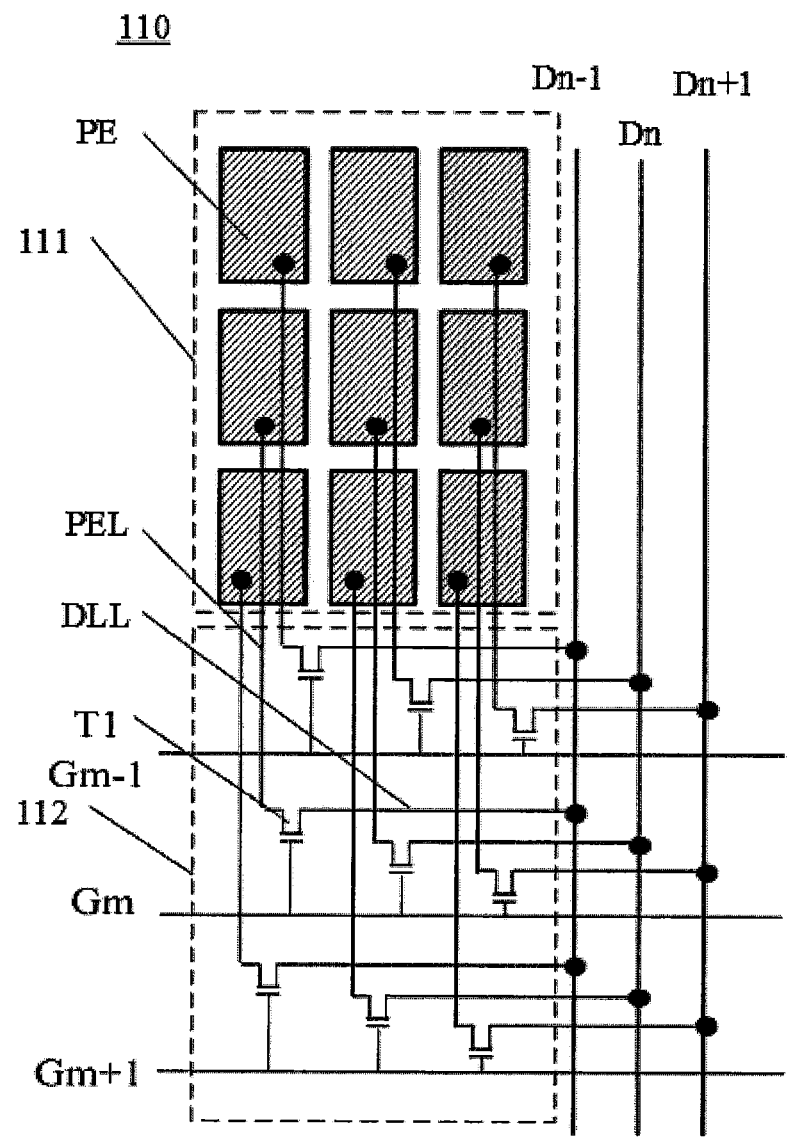
FIG. 3 illustrates a partial schematic diagram of a pixel region in the array substrate of FIG. 2.

FIG. 2 illustrates a schematic structural diagram of an array substrate 100 according to an embodiment of the present disclosure, and FIG. 3 illustrates a partial schematic diagram of an upper left pixel region 110 in the array substrate 100 of FIG. 2.

Referring to FIG. 2, the array substrate 100 includes a plurality of pixel regions 110 arranged in rows and columns, a plurality of sets of gate lines extending in the row direction x (a first set of gate lines including Gm−1, Gm, and Gm+1 and a second set of gate lines including Gm+2, Gm+3, and Gm+4 are shown in this example), and a plurality of sets of data lines extending in the column direction y intersecting with the row direction x (a first set of data lines including Dn−1, Dn, and Dn+1 and a second set of data lines including Dn+2, Dn+3, and Dn+4 are shown in this example).

Referring to FIG. 3, each pixel region 110 includes a corresponding pixel electrode array 111 and a corresponding pixel circuit 112 associated with the pixel electrode array 111. Each pixel electrode array 111 includes a plurality of pixel electrodes PE arranged in an array. Each pixel circuit 112 is connected to a plurality of pixel electrodes PE of a corresponding pixel electrode array 111, a corresponding set of gate lines (Gm−1, Gm, and Gm+1 in this example), and a corresponding set of data lines (Dn−1, Dn, and Dn+1 in this example).

In this embodiment, each pixel circuit 112 includes a corresponding plurality of first transistors T1. Each first transistor T1 includes a gate electrode connected to a corresponding one gate line of the corresponding set of gate lines Gm−1, Gm, and Gm+1, a first electrode receiving a signal from a corresponding one data line of the corresponding set of data lines Dn−1, Dn, and Dn+1, and a second electrode connected to a corresponding one of the plurality of pixel electrodes PE of the corresponding one of the pixel electrode arrays 111. It should be noted that the terms such as "a first electrode receiving a signal from a corresponding one data line of the corresponding set of data lines Dn−1, Dn, and Dn+1" mean that the first electrode of the first transistor T1 may be directly connected to a corresponding one data line of the corresponding set of data lines Dn−1, Dn, and Dn+1 to receive a signal from the data line, or may be connected to a corresponding one data line of the corresponding set of data lines Dn−1, Dn, and Dn+1 via one or more other elements to receive a signal from the data line. Exemplarily, in FIG. 3, the first transistor labeled with a reference symbol "T1" includes a gate electrode connected to the gate line Gm, a first electrode connected to the data line Dn−1, and a second electrode connected to the pixel electrode PE in the second row and the first column of the pixel electrode array 111. Specifically, a first electrode of the first transistor T1 is connected to the data line Dn−1 via a data line lead DLL, and a second electrode of the first transistor T1 is connected to the pixel electrode PE via an electrode lead PEL. The data line lead DLL may be made of a metal material (e.g., aluminum, molybdenum, copper, or a combination thereof). The material of the electrode lead PEL may also be made of such a metal material. Alternatively, the electrode lead PEL may be made of a transparent conductive material (e.g., indium tin oxide or indium zinc oxide) to improve visual effects.

More generally, the gate electrodes of different first transistors T1 connected to pixel electrodes PE in different rows are connected to respective different gate lines of the corresponding set of gate lines Gm−1, Gm, and Gm+1, and the first electrodes of different first transistors T1 connected to pixel electrodes PE in different columns are connected to respective different data lines of the corresponding set of data lines Dn−1, Dn, and Dn+1. For example, the gate electrodes of the upper right first transistor T1 and the lower right first transistor T1 are connected to the gate lines Gm−1 and Gm+1, respectively, and the first electrodes of the lower left first transistor T1 and the lower right first transistor T1 are connected to the data lines Dn−1 and Dn+1, respectively. In this way, in each pixel electrode array 111, pixel electrodes PE in the same row can be driven by a signal of the same gate line and signals of respective different data lines, thereby realizing a normal display function.

It will be understood that the pixel circuit 112 shown in FIG. 3 is exemplary. The pixel circuit 112 may be in any suitable form depending on the type of the display substrate 100. For example, in the case of a liquid crystal display, the pixel circuit 112 may simply include a transistor array as shown in FIG. 3, and in this case, each pixel electrode PE constitutes an electrode plate of a corresponding liquid crystal capacitor. In the case of an organic light emitting diode display, the pixel circuit 112 may include a plurality of driving circuits, each driving circuit is for driving a corresponding organic light emitting diode to emit light, and in this case, each pixel electrode PE constitutes, for example, an anode of a corresponding organic light emitting diode.

Referring back to FIG. 2, the pixel electrode arrays 111 are arranged in rows and columns, and the plurality of sets of gate lines and rows of pixel electrode arrays 111 are alternately arranged with each other in the column direction y. The plurality of sets of data lines and columns of pixel regions 110 are alternately arranged with each other in the row direction x. As shown in FIG. 2, since no gate line and data line are provided between the pixel electrodes PE in each pixel electrode array 111, the arrangement of the pixel electrodes PE is denser. This results in a significantly improved PPI within each pixel electrode array 111.

In the example of FIG. 2, each pixel electrode array 111 includes 3×3 pixel electrodes PE, each set of gate lines includes 3 gate lines, and each set of data lines also includes 3 data lines. However, the present disclosure is not limited thereto. For example, each pixel electrode array 111 may include, for example, 2×2 pixel electrodes PE, 2×4 pixel electrodes PE, or 2×1 pixel electrodes PE. More generally, the plurality of pixel electrodes PE of each pixel electrode array 111 are arranged in an M×N array, each set of gate lines includes M gate lines, and each set of data lines includes N data lines. M is an integer greater than 1, and N is an integer greater than or equal to 1. Alternatively, M is an integer greater than or equal to 1, and N is an integer greater than 1.

Figure 4:
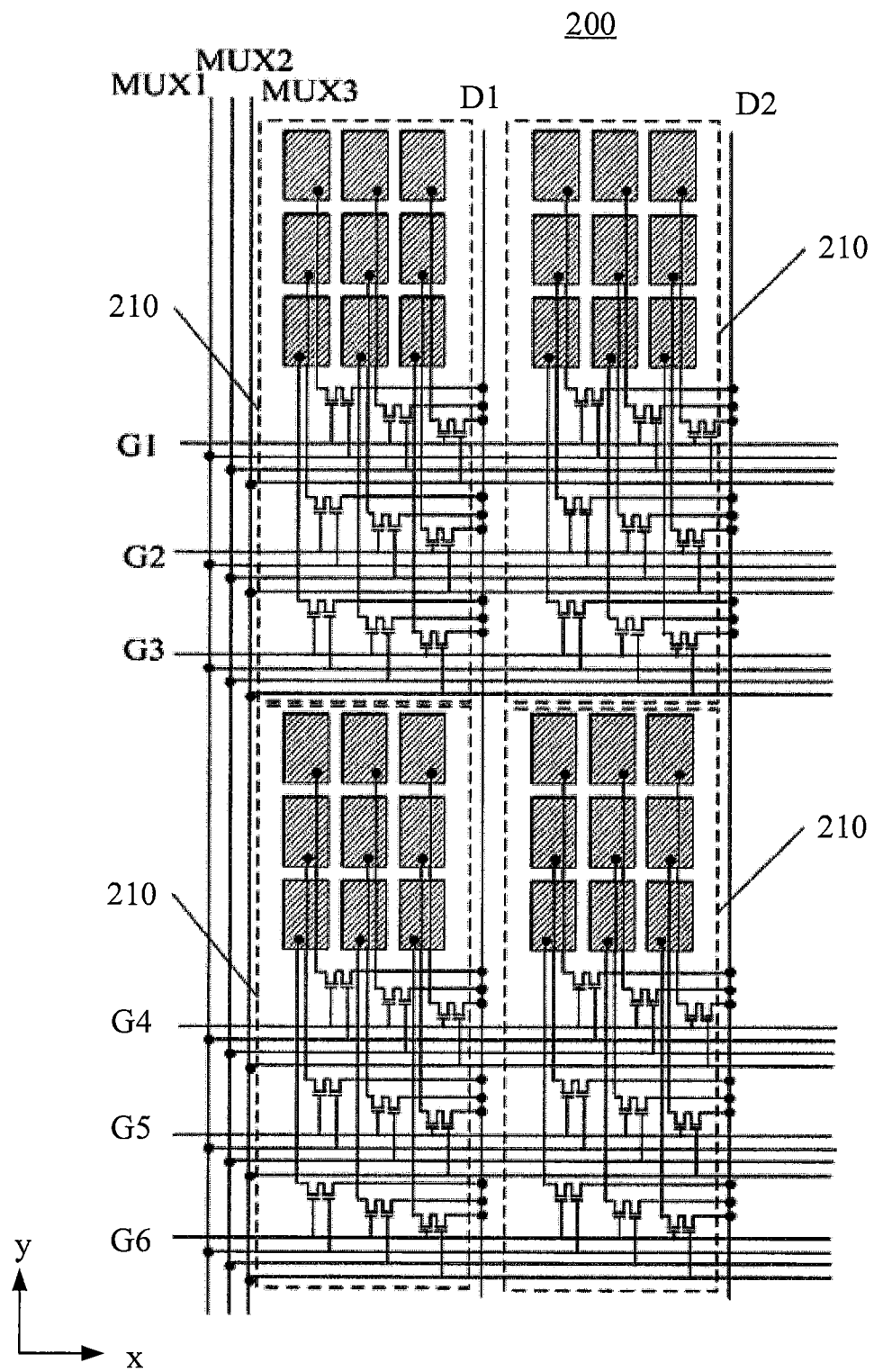
FIG. 4 illustrates a schematic structural diagram of an array substrate according to another embodiment of the present disclosure.
Figure 5:
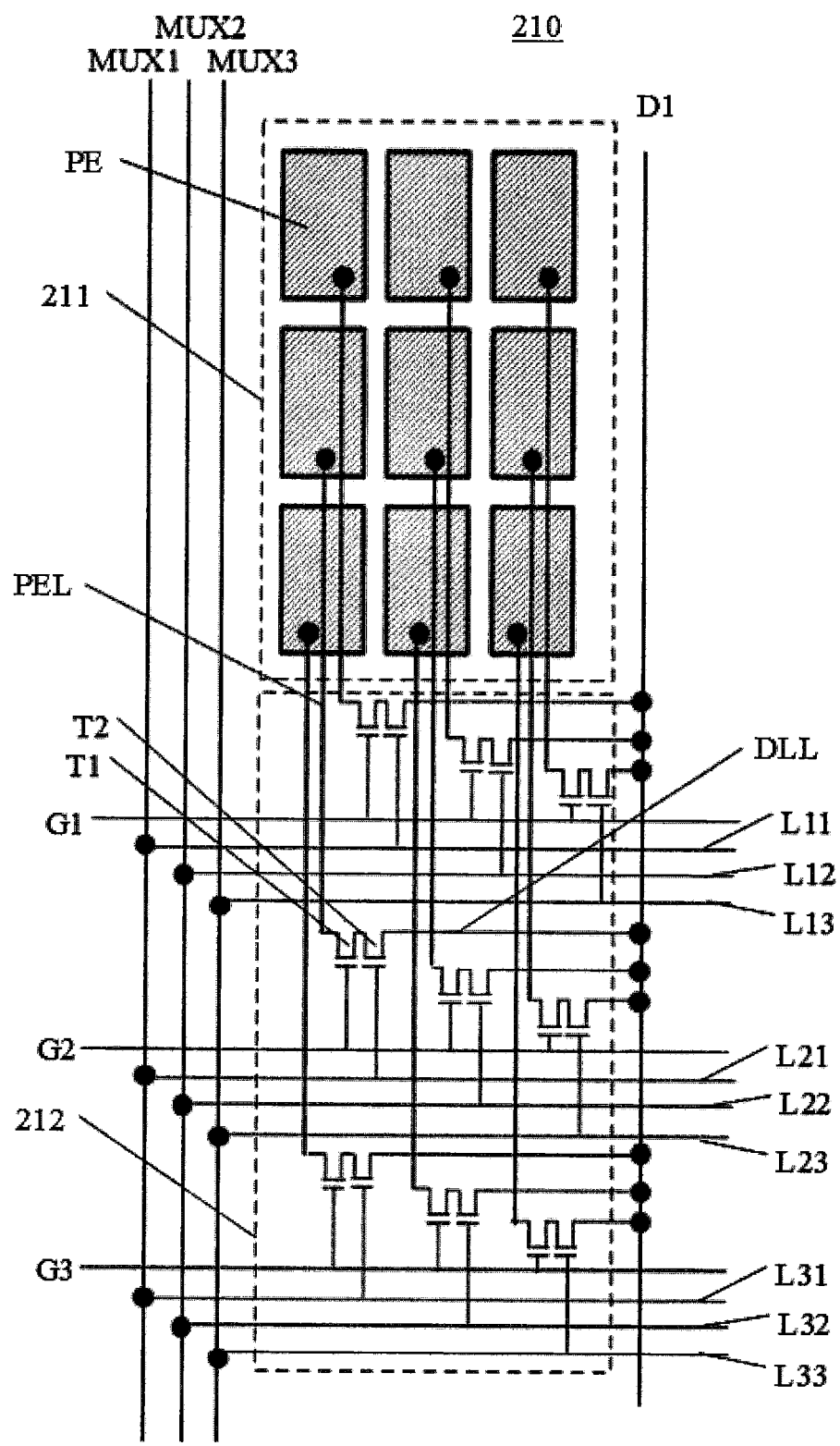
FIG. 5 illustrates a partial schematic diagram of a pixel region in the array substrate of FIG. 4.

FIG. 4 illustrates a schematic structural diagram of an array substrate 200 according to another embodiment of the present disclosure, and FIG. 5 illustrates a partial schematic diagram of an upper left pixel region 210 in the array substrate 200 of FIG. 4.

Similar to the array substrate 100, the array substrate 200 includes a plurality of pixel regions 210 arranged in rows and columns, a plurality of sets of gate lines extending in the row direction x (a first set of gate lines including G1, G2, and G3 and a second set of gate lines including G4, G5, and G6 are shown in this example), and a plurality of sets of data lines extending in the column direction y intersecting with the row direction x (a first set of data lines including D1 and a second set of data lines including D2 are shown in this example). Referring to FIG. 5, each pixel region 210 includes a corresponding pixel electrode array 211 and a corresponding pixel circuit 212 associated with the pixel electrode array 211. Each pixel electrode array 211 includes a plurality of pixel electrodes PE arranged in an array. Each pixel circuit 212 is connected to a plurality of pixel electrodes PE of a corresponding pixel electrode array 211, a corresponding set of gate lines (in this example, G1, G2, and G3), and a corresponding set of data lines (in this example, D1).

Unlike the array substrate 100, the array substrate 200 further includes a set of multiplexed lines (MUX1, MUX2, and MUX3 in the example of FIGS. 4 and 5) extending in the column direction y, and each set of data lines includes a corresponding single data line (D1 or D2 in the example of FIGS. 4 and 5). As shown in FIG. 5, each pixel circuit 212 includes a plurality of pairs of transistors, and each pair of transistors includes a first transistor T1 including a gate electrode connected to a corresponding one gate line of the corresponding set of gate lines G1, G2, and G3, a first electrode, and a second electrode connected to a corresponding one of the plurality of pixel electrodes PE of the corresponding one of the pixel electrode arrays 211; and a second transistor T2 including a gate electrode connected to a corresponding one multiplexed line of the set of multiplexed lines MUX1, MUX2, and MUX3, a first electrode connected to a single data line of the corresponding set of data lines D1, and a second electrode connected to the first electrode of the first transistor T1. In the example of FIG. 5, the first transistor labeled with the reference symbol "T1" includes a gate electrode connected to the gate line G2, a first electrode connected to a second electrode of a second transistor labeled with the reference symbol "T2", and a second electrode connected to a pixel electrode PE in the second row and the first column in the pixel electrode array 211, and the second transistor labeled with the reference symbol "T2" includes a gate electrode connected to the multiplexed line MUX1, a first electrode connected to the data line D1, and a second electrode connected to the first electrode of the first transistor labeled with the reference symbol "T1". Specifically, the gate electrode of the second transistor T2 is connected to the multiplexed line MUX1 via the multiplexed line lead L21. The corresponding multiplexed line leads L11, L12, L13, L22, L23, L31, L32, and L33 for other second transistors are also shown in FIG. 5. The multiplexed lines MUX1, MUX2, and MUX3 and the multiplexed line leads L11, L12, L13, L21, L22, L23, L31, L32, and L33 may be made of a metal material (e.g., aluminum, molybdenum, copper, or a combination thereof).

More generally, the gate electrodes of the respective first transistors T1 in different pairs of transistors connected to the pixel electrodes PE in different rows are connected to respective different gate lines in the corresponding set of gate lines G1, G2, and G3, and in each pixel region, the gate electrodes of the respective second transistors T2 in different pairs of transistors connected to the pixel electrodes PE in different columns are connected to respective different multiplexed lines in the set of multiplexed lines MUX1, MUX2, and MUX3. For example, the gate electrodes of the upper right first transistor T1 and the lower right first transistor T1 are connected to the gate lines G1 and G3, respectively, and the first electrodes of the lower left second transistor T2 and the lower right second transistor T2 are connected to the multiplexed lines MUX1 and MUX3, respectively. As will be described below, the multiplexed lines MUX1, MUX2, and MUX3 transmit their respective scanning pulse signals in a time division manner during the gate scan. This allows the pixel electrodes PE in the same row to be supplied with different data voltages from the same data line in each pixel electrode array 211. In this way, in each pixel electrode array 211, the pixel electrodes PE in the same row can be driven by a signal from the same gate line and a signal from the same data line, thereby realizing a normal display function.

By providing the multiplexed lines MUX1, MUX2, and MUX3 and the second transistor T2, the data lines in the array substrate 200 are reduced, and thus the PPI of the array substrate 200 is further improved. It will be understood that the arrangement of multiplexed lines MUX1, MUX2, and MUX3 in FIG. 4 is exemplary, and in other embodiments, the multiplexed lines MUX1, MUX2, and MUX3 may be arranged at other positions. For example, the multiplexed lines MUX1, MUX2, and MUX3 may be provided on the right side of the array substrate 200.

In the example of FIG. 4, each pixel electrode array 211 includes 3×3 pixel electrodes PE, each set of gate lines includes 3 gate lines, and the set of multiplexed lines also includes 3 multiplexed lines. However, the present disclosure is not limited thereto. For example, each pixel electrode array 211 may include, for example, 2×2 pixel electrodes PE, 2×4 pixel electrodes PE, or 2×1 pixel electrodes PE. More generally, the plurality of pixel electrodes PE of each pixel electrode array 211 are arranged in an M×N array, each set of gate lines includes M gate lines, and the set of multiplexed lines includes N multiplexed lines. M is an integer greater than 1, and N is an integer greater than or equal to 1. Alternatively, M is an integer greater than or equal to 1, and N is an integer greater than 1.

Figure 6:
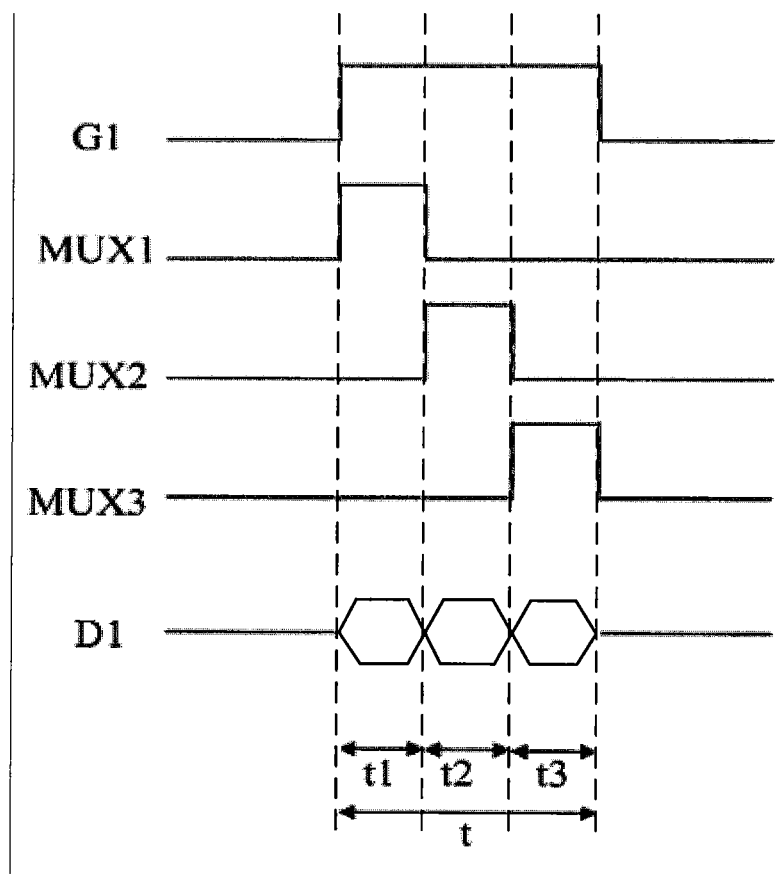
FIG. 6 illustrates a timing diagram for driving pixel electrodes in the pixel region of FIG. 5.

FIG. 6 shows a timing chart for driving the pixel electrodes PE in the pixel region 210 of FIG. 5.

For the gate line G1, the gate scanning signal is valid (high level in this example) for a time period t. The time period t includes a first time period t1, a second time period t2, and a third time period t3. The multiplexed lines MUX1, MUX2, and MUX3 transmit their respective scanning pulse signals in a time division manner during the time period t, wherein the respective scanning pulse signals are respectively valid for the first time period t1, the second time period t2, and the third time period t3.

For the first time period t1, the scanning pulse signal on the multiplexed line MUX1 is valid, and a first data voltage is applied to the data line D1. The first data voltage is transmitted to the pixel electrode PE in the first row and the first column.

For the second time period t2, the scanning pulse signal on the multiplexed line MUX2 is valid, and a second data voltage is applied to the data line D1. The second data voltage is transmitted to the pixel electrode PE in the first row and the second column.

For the third time period t3, the scanning pulse signal on the multiplexed line MUX3 is valid, and a third data voltage is applied to the data line D1. The third data voltage is transmitted to the pixel electrode PE in the first row and the third column.

Next, a valid gate scanning signal is supplied to the gate line G2, and respective scanning pulse signals are sequentially supplied to the multiplexed lines MUX1, MUX2, and MUX3, and respective data voltages are supplied to the data line D1 in synchronization with the scanning pulse signals on the multiplexed lines MUX1, MUX2, and MUX3. These data voltages are transmitted to the pixel electrode PE in the second row and the first column, the pixel electrode PE in the second row and the second column, and the pixel electrode PE in the second row and the third column, respectively. Finally, a valid gate scanning signal is supplied to the gate line G3, respective scanning pulse signals are sequentially supplied to the multiplexed lines MUX1, MUX2, and MUX3, and respective data voltages are supplied to the data line D1 in synchronization with the scanning pulse signals on the multiplexed lines MUX1, MUX2, and MUX3. These data voltages are transmitted to the pixel electrode PE in the third row and the first column, the pixel electrode PE in the third row and the second column, and the pixel electrode PE in the third row and the third column, respectively.

Figure 7:
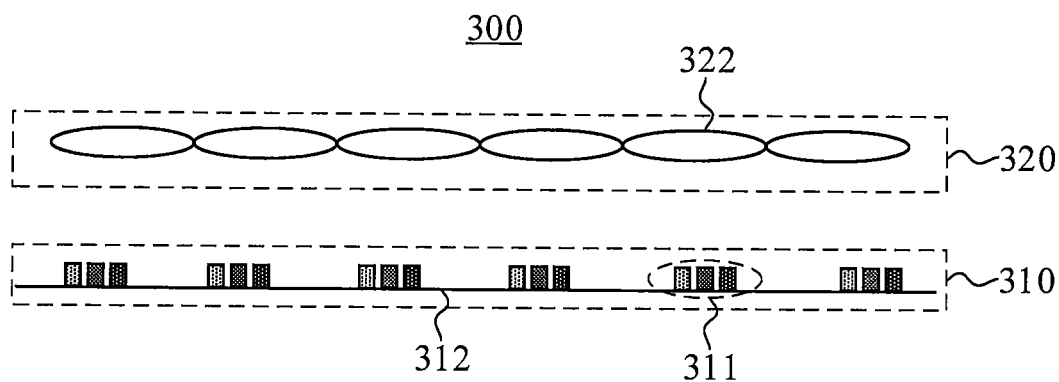
FIG. 7 illustrates a schematic structural diagram of a display device according to an embodiment of the present disclosure.

FIG. 7 illustrates a schematic structural diagram of a display device 300 according to an embodiment of the present disclosure.

Referring to FIG. 7, the display device 300 includes a display panel 310 including an array substrate 312. The array substrate 312 may take the form of the array substrate 100 or 200 described in conjunction with the above embodiments. FIG. 7 shows a plurality of pixel electrode arrays 311 in the array substrate 312, each of which may take the form of the pixel electrode array 111 or 211 depending on the implementation of the array substrate 312. In the case of a liquid crystal display, the display panel 310 may further include a counter substrate (not shown) opposite to the array substrate 312. In the case of an organic light emitting diode display, the display panel 310 may further include a cover plate (not shown) opposite to the array substrate 312.

In the example of FIG. 7, the display device 300 further includes a lens array 320, and the lens array 320 is on the light exit side of the display panel 310. The lens array 320 includes a plurality of lenses 322, and each lens 322 is arranged to be opposed to a corresponding pixel electrode array in the pixel electrode arrays 311. The pixels corresponding to the pixel electrode arrays 311 are used to display corresponding elemental images, which are then projected to the viewing area by the plurality of lenses 322. This enables the display device 300 to be a three-dimensional display based on integral imaging.

Figure 8:
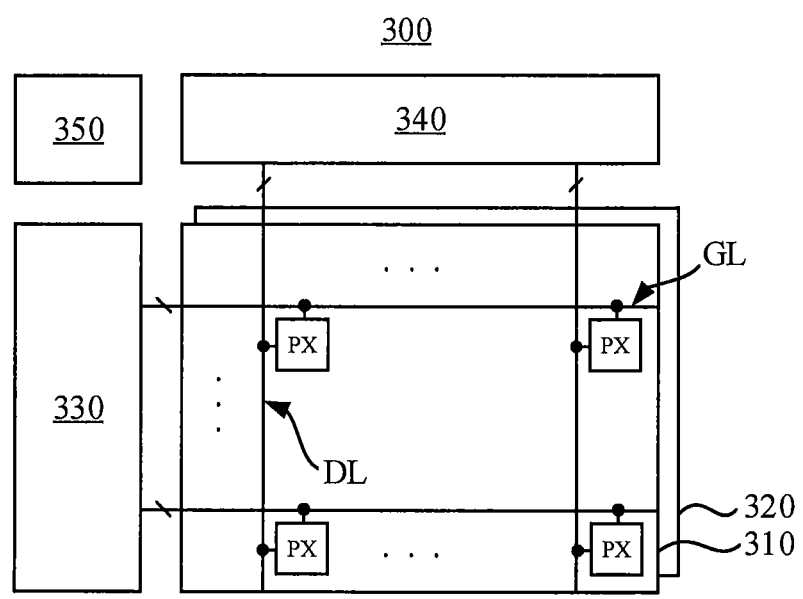
FIG. 8 illustrates a schematic block diagram of the display device of FIG. 7.

FIG. 8 shows a schematic block diagram of the display device 300. Referring to FIG. 8, the display device 300 includes a display panel 310, a lens array 320, a gate driver 330, a data driver 340, and a timing controller 350.

The display panel 310 includes the array substrate 312 (not shown in FIG. 8) as described above, such as the array substrate 100 or 200. In the case of a liquid crystal display, the display panel 310 may further include a counter substrate (not shown) opposite to the array substrate and a liquid crystal layer (not shown) sandwiched between the array substrate and the counter substrate. In the case of an organic light emitting diode display, the display panel 310 may further include a cover plate (not shown) opposite to the array substrate. The display panel 310 includes a plurality of sets of gate lines GL, a plurality of sets of data lines DL, and a plurality of pixel regions PX, such as a plurality of pixel regions 110 or 210. The pixel regions PX are at corresponding intersections defined by a plurality of sets of gate lines GL and a plurality of sets of data lines DL. In the case of the array substrate 200, the display panel 310 further includes a set of multiplexed lines (not shown).

The gate driver 330 is electrically connected to the sets of gate lines GL and sequentially supplies a gate scanning signal to the gate lines. In some exemplary embodiments, the gate driver 330 may be integrated in the display panel 310. Alternatively, the gate driver 330 may be connected to the display panel 310 through a tape carrier package (TCP). The gate driver 330 may be implemented by typical techniques in the art, and will not be described in detail herein.

The data driver 340 is electrically connected to the sets of data lines DL and applies data voltages to the data lines. In some embodiments, the data driver 340 may include multiple data driving chips operating in parallel. The data driver 340 may be implemented by typical techniques in the art, and will not be described in detail herein.

The timing controller 350 controls the operation of each of the gate driver 330 and the data driver 340. Specifically, the timing controller 350 outputs a data control signal and image data to control a driving operation of the data driver 340, and outputs a gate control signal to control a driving operation of the gate driver 330. In the case of the array substrate 200, the timing controller 350 may further include or control a circuit (not shown) for generating scanning pulse signals (as shown in FIG. 6) to be sequentially applied to the set of multiplexed lines. The timing controller 350 may be implemented by typical techniques in the art. Typically, the timing controller 350 may be a conventional processor, controller, microcontroller, application specific integrated circuit (ASIC), field programmable gate array (FPGA), or state machine. The timing controller 350 may also be implemented as a combination of computing devices, such as a combination of a DSP and a microprocessor, multiple microprocessors, one or more microprocessors in conjunction with a DSP core, or any other such configurations.

By way of example and not limitation, the display device 300 may be any product or component including a display function such as a mobile phone, a tablet computer, a television, a display, a notebook computer, a digital photo frame, a navigator, and the like.

Variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

The invention claimed is:

1. An array substrate comprising:
    a plurality of pixel regions in rows and columns, wherein the plurality of pixel regions comprise a corresponding pixel electrode array and a corresponding pixel circuit associated with the corresponding pixel electrode array, wherein the pixel electrode arrays are in rows and columns, and wherein each pixel electrode array comprises a plurality of pixel electrodes in an array;
    a plurality of sets of gate lines extending in a row direction, wherein the plurality of sets of gate lines and rows of the pixel electrode arrays are alternately arranged with each other in a column direction intersecting with the row direction;
    a plurality of sets of data lines extending in the column direction, wherein the plurality of sets of data lines and columns of the pixel regions are alternately arranged with each other in the row direction, and
    a set of multiplexed lines extending in the column direction, wherein each set of data lines comprises a corresponding single data line,
    wherein each pixel circuit is connected to a plurality of pixel electrodes of a corresponding one of the pixel electrode arrays, a corresponding set of gate lines of the plurality of sets of gate lines, and a corresponding set of data lines of the plurality of sets of data lines,
    wherein each pixel electrode array is electrically connected to a corresponding set of data lines of the plurality of sets of data lines, and all the data lines in the corresponding set of data lines are on a same side of the pixel electrode array, and
    wherein each pixel circuit comprises a plurality of pairs of transistors, and each pair of transistors comprises:

a first transistor comprising a gate electrode connected to a corresponding one gate line of the corresponding set of gate lines, a first electrode, and a second electrode connected to a corresponding one of the plurality of pixel electrodes of the corresponding one of the pixel electrode arrays; and a second transistor comprising a gate electrode connected to a corresponding one multiplexed line of the set of multiplexed lines, a first electrode connected to the single data line of the corresponding set of data lines, and a second electrode connected to the first electrode of the first transistor.

2. The array substrate according to claim 1, wherein the gate electrodes of respective first transistors of different pairs of transistors connected to pixel electrodes in different rows are connected to respective different gate lines of the corresponding set of gate lines, and wherein in each pixel region, the gate electrodes of the respective second transistors of different pairs of transistors connected to pixel electrodes in different columns are connected to respective different multiplexed lines of the set of multiplexed lines.

3. The array substrate according to claim 1, wherein the plurality of pixel electrodes of each pixel electrode array are in an M×N array, wherein each set of gate lines comprises M gate lines, and wherein the set of multiplexed lines further comprises N multiplexed lines.

4. The array substrate according to claim 1, wherein each pixel region further comprises a corresponding plurality of electrode leads, and wherein each pixel circuit is connected to the corresponding one of the plurality of pixel electrodes of the corresponding one of the pixel electrode arrays via the corresponding plurality of electrode leads.

5. The array substrate according to claim 4, wherein the plurality of electrode leads comprise a transparent conductive material.

6. The array substrate according to claim 5, wherein the transparent conductive material comprises indium tin oxide or indium zinc oxide.

7. A display panel comprising the array substrate according to claim 1.

8. A display device comprising the display panel according to claim 7.

9. The display device according to claim 8, further comprising:

a lens array on a light exit side of the display panel, wherein the lens array comprises a plurality of lenses, and wherein a corresponding one of the plurality of lenses is opposite to a corresponding one of the pixel electrode arrays.

10. The display panel according to claim 7, wherein the gate electrodes of respective first transistors of different pairs of transistors connected to pixel electrodes in different rows are connected to respective different gate lines of the corresponding set of gate lines, and wherein in each pixel region, the gate electrodes of the respective second transistors of different pairs of transistors connected to pixel electrodes in different columns are connected to respective different multiplexed lines of the set of multiplexed lines.

11. The display panel according to claim 7, wherein each pixel region further comprises a corresponding plurality of electrode leads, and wherein each pixel circuit is connected to the corresponding one of the plurality of pixel electrodes of the corresponding one of the pixel electrode arrays via the corresponding plurality of electrode leads.

12. The display panel according to claim 11, wherein the plurality of electrode leads comprise a transparent conductive material.

* * * * *